(12) United States Patent
Cheng et al.

(10) Patent No.: US 9,530,341 B2
(45) Date of Patent: Dec. 27, 2016

(54) ARRAY SUBSTRATE, DRIVING METHOD OF ARRAY SUBSTRATE AND DISPLAY DEVICE

(71) Applicant: BOE TECHNOLOGY GROUP CO., LTD., Beijing (CN)

(72) Inventors: Hongfei Cheng, Beijing (CN); Yuxin Zhang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 21 days.

(21) Appl. No.: 14/428,803

(22) PCT Filed: Jun. 24, 2014

(86) PCT No.: PCT/CN2014/080583
§ 371 (c)(1),
(2) Date: Mar. 17, 2015

(87) PCT Pub. No.: WO2015/043256
PCT Pub. Date: Apr. 2, 2015

(65) Prior Publication Data
US 2016/0027356 A1    Jan. 28, 2016

(30) Foreign Application Priority Data
Sep. 30, 2013 (CN) .......................... 2013 1 0461064

(51) Int. Cl.
    *G09G 3/20*      (2006.01)
    *H01L 27/12*      (2006.01)
    *G06F 3/041*      (2006.01)

(52) U.S. Cl.
    CPC ............... *G09G 3/20* (2013.01); *G06F 3/0412* (2013.01); *H01L 27/12* (2013.01); *G09G 2300/0804* (2013.01); *G09G 2310/08* (2013.01)

(58) Field of Classification Search
None
See application file for complete search history.

(56) References Cited

U.S. PATENT DOCUMENTS

2012/0086654 A1    4/2012    Song
2015/0220174 A1*   8/2015    Mu ........................ G06F 3/044
                                                    345/174

FOREIGN PATENT DOCUMENTS

CN      101131618 A      2/2008
CN      102768604 A     11/2012
(Continued)

OTHER PUBLICATIONS

Written Opinion of the International Searching Authority dated Sep. 24, 2014 corresponding to International application No. PCT/CN2014/080583.

(Continued)

*Primary Examiner* — Kenneth B Lee, Jr.
(74) *Attorney, Agent, or Firm* — Nath, Goldberg & Meyer; Joshua B. Goldberg

(57) ABSTRACT

The present invention provides an array substrate, a driving method of the array substrate and a display device comprising the array substrate. The array substrate comprises a display region and a non-display region, multiple groups of source lines and a plurality of gate lines are arranged in the display region, the multiple groups of source lines and the plurality of gate lines are intersected with each other to divide the display region into a plurality of pixel regions, and each pixel region corresponds to a group of source lines, wherein a first electrode and a second electrode are arranged in each pixel region, and the first electrode and the second electrode are adjacent and electrically isolated from each other.

11 Claims, 3 Drawing Sheets

(56) References Cited

FOREIGN PATENT DOCUMENTS

| | | |
|---|---|---|
| CN | 103150069 A | 6/2013 |
| CN | 103500747 A | 1/2014 |
| CN | 203519963 U | 4/2014 |

OTHER PUBLICATIONS

Notification of the First Office Action dated Jul. 1, 2015 corresponding to Chinese application No. 201310461064.7.
Search Report issued in International Application No. PCT/CN2014/080583, dated Jun. 24, 2014.
Office Action dated Apr. 22, 2016 issued in corresponding Chinese Application No. 201310461064.7.

\* cited by examiner

ARRAY SUBSTRATE, DRIVING METHOD OF ARRAY SUBSTRATE AND DISPLAY DEVICE

This is a National Phase Application filed under 35 U.S.C. 371 as national stage of PCT/CN2014/080583, filed Jun. 24, 2014, an application claiming the benefit to Chinese application No. 201310461064.7, filed on Sep. 30, 2013; the content of each of which is hereby incorporated by reference in its entirety.

FIELD OF THE INVENTION

The present invention relates to the technical field of display technology, and particularly relates to an array substrate, a driving method of the array substrate and a display device including the array substrate.

BACKGROUND OF THE INVENTION

A touch panel is a latest information input equipment at present. The touch panel may simply, conveniently and naturally realize man-machine interaction, so as to provide a brand-new multimedia man-machine interaction method for people. The touch panel, which has the advantages of sensitive touch response, multi-point touch support and the like, greatly satisfies the enjoyment of vision and touch of people.

At present, touch panels may be divided into add on mode touch panels, on cell touch panels and in cell touch panels according to their configurations. Due to different structures of the touch panels, the design schemes of the touch panels are also diverse. Taking a liquid crystal display device with a touch control function as an example, a display panel and a touch panel of the liquid crystal display device are generally separately manufactured, namely sensing electrodes and driving electrodes may be manufactured inside, on the surface of or outside the display panel of the liquid crystal display device, and connected with corresponding sensing signal lines and driving signal lines. When a user touches the touch panel, touch of the user is "sensed" through the change of an electric field between the sensing electrodes and the driving electrodes, to realize the touch control function.

In the structure of the display device of which the display panel and the touch panel are separately manufactured, the display device is provided with multiple separated electrodes (the display panel is provided with pixel electrodes, and the touch panel is provided with sensing electrodes and driving electrodes), so that the manufacturing process of the display device involves numerous steps and repeated manufacturing procedures, electrode materials and manufacturing procedures are wasted, and the production cost of the display device is increased. Meanwhile, the display panel and the touch panel need to be assembled subsequently, so that the process steps are further increased, and the product yield is reduced.

Therefore, how to reduce the production cost of the display device, reduce the process steps and further improve the product yield are technical problems to be urgently solved at present.

SUMMARY OF THE INVENTION

An object of the present invention is to provide an array substrate, a driving method of the array substrate and a display device including the array substrate. In the array substrate, two electrodes in the same pixel region serve as pixel electrodes for display and a sensing electrode and a driving electrode for touch control in a time-division multiplexed manner, so that the process steps of manufacturing the array substrate are reduced, electrode materials are saved, and the product cost is reduced.

A technical solution adopted for solving the technical problems of the present invention involves an array substrate, including a display region and a non-display region, wherein multiple groups of source lines and a plurality of gate lines are arranged in the display region, the multiple groups of source lines and the plurality of gate lines are intersected with each other to divide the display region into a plurality of pixel regions, and each pixel region corresponds to a group of source lines, wherein a first electrode and a second electrode are arranged in each pixel region, the first electrode and the second electrode are adjacent and electrically isolated from each other, and the first electrode and the second electrode serve as pixel electrodes for display and a sensing electrode and a driving electrode for touch control in a time division multiplexed manner.

Preferably, a group of source lines include a first source line and a second source line, a first thin film transistor and a second thin film transistor are arranged in each pixel region, the drain of the first thin film transistor is electrically connected with the first electrode, the source of the first thin film transistor is electrically connected with the first source line, the drain of the second thin film transistor is electrically connected with the second electrode, and the source of the second thin film transistor is electrically connected with the second source line.

Preferably, in each pixel region, the gate of the first thin film transistor and the gate of the second thin film transistor are electrically connected with the same gate line.

Preferably, the first electrode and the second electrode are slit-like or plate-like.

A display device includes the above-mentioned array substrate.

Preferably, the display device includes a gate driver and a source driver which are arranged in the non-display region, the gate driver is electrically connected with the plurality of gate lines, and the source driver is electrically connected with the multiple groups of source lines.

Preferably, the display device further includes a voltage converter, which is arranged in the non-display region, electrically connected with the source driver to receive a data signal transmitted by the source driver, and also electrically connected with the source of the first thin film transistor and the source of the second thin film transistor to transmit the data signal to the source of the first thin film transistor and the source of the second thin film transistor.

Preferably, the display device further includes a transmitter and a touch controller which are arranged in the non-display region, the transmitter is electrically connected with the voltage converter to transmit a control signal to the voltage converter, the touch controller is electrically connected with the voltage converter, the voltage converter is electrically connected with the first electrode through the drain of the first thin film transistor and electrically connected with the second electrode through the drain of the second thin film transistor, and the touch controller is configured to acquire a sensing signal and transmit a driving signal through the voltage converter.

Preferably, the display device further includes a common electrode, and the common electrode is at least partially overlapped with the first electrode and the second electrode in the orthographic projection direction.

Preferably, the common electrode is included in a color filter substrate.

A driving method of the array substrate is provided, wherein the array substrate includes a display region and a non-display region, multiple groups of source lines and a plurality of gate lines are arranged in the display region, the multiple groups of source lines and the plurality of gate lines are intersected with each other to divide the display region into a plurality of pixel regions, each pixel region corresponds to a group of source lines, and a first electrode and a second electrode which are electrically isolated from each other are adjacently arranged in each pixel region; and the driving method includes: causing the first electrode and the second electrode to serve as pixel electrodes for display and a sensing electrode and a driving electrode for touch control in a time division multiplexed manner.

Preferably, the first electrode and the second electrode serve as the pixel electrodes for display within a first time period and serve as the sensing electrode and the driving electrode for touch control within a second time period, the first time period is longer than or equal to the second time period, and the sum of the first time period and the second time period is equal to a frame cycle.

Preferably, a first thin film transistor and a second thin film transistor are arranged in each pixel region, a group of source lines include a first source line and a second source line, the drain of the first thin film transistor is electrically connected with the first electrode, the source of the first thin film transistor is electrically connected with the first source line, the drain of the second thin film transistor is electrically connected with the second electrode, and the source of the second thin film transistor is electrically connected with the second source line; and the driving method includes: outputting a first signal to the source of the first thin film transistor through the first source line, and outputting a second signal to the source of the second thin film transistor through the second source line, wherein the first signal is a video data signal within the first time period and a sensing signal within the second time period, the second signal is a video data signal within the first time period and a driving signal within the second time period, the first source line is a data line within the first time period and a sensing signal line within the second time period, and the second source line is a data line within the first time period and a driving signal line within the second time period.

Preferably, in each pixel region, the gate of the first thin film transistor and the gate of the second thin film transistor are electrically connected with the same gate line; and the driving method includes: outputting a scanning signal to the gate of the first thin film transistor and the gate of the second thin film transistor through the gate line, wherein the scanning signal is a square wave pulse signal.

Preferably, the scanning signal sequentially and circularly scans within the first time period to select the first thin film transistor and the second thin film transistor electrically connected with the gate line, and the scanning signal sequentially and circularly scans within the second time period to select the first thin film transistor and the second thin film transistor electrically connected with the gate line.

Preferably, the first thin film transistor and the second thin film transistor are simultaneously selected within the first time period and respectively turned on at least once, and the first thin film transistor and the second thin film transistor are simultaneously selected within the second time period and respectively turned on at least once.

The present invention has the beneficial effects: the array substrate provided by the present invention realizes a display function and a touch control function within different time periods by using the two electrodes in the same pixel region, and meanwhile, realizes a data line function and a sensing signal line/driving signal line function within different time periods by using the corresponding source lines, namely the pixel electrodes and the sensing electrode/driving electrode are of the same electrodes, so based on the pixel electrodes for display in the existing display device, the sensing electrode/driving electrode and the sensing signal line/driving signal line for touch control do not need to be additionally manufactured, electrode materials are saved, the process steps are greatly simplified, the production cost is reduced, and the product yield is improved.

BRIEF DESCRIPTION OF THE DRAWINGS

The accompanying drawings are used for further understanding the present invention, constitute a part of the specification, and are also used for interpreting the present invention together with the following specific implementations, rather than limiting the present invention. In which.

REFERENCE SIGNS

1—first substrate; 2—first electrode; 3—second electrode; 4—first source line; 5—second source line; 6—first thin film transistor; 7—second thin film transistor; 8—insulating layer; 9—common electrode; 10—gate line; 11—array substrate; 12—color filter substrate; 13—backlight; 14—liquid crystal molecule; 15—source driver; 16—gate driver; 17—voltage converter; 18—touch controller; 19—transmitter; 20—first time period; 21—second time period.

DETAILED DESCRIPTION OF THE EMBODIMENTS

The specific implementations of the present invention will be described in detail below in conjunction with the accompanying drawings. It should be understood that, the specific implementations described herein are merely used for describing and interpreting the present invention, rather than limiting the present invention.

The present invention provides an array substrate, including a display region and a non-display region, wherein multiple groups of source lines and a plurality of gate lines are arranged in the display region, the multiple groups of source lines and the plurality of gate lines are intersected with each other to divide the display region into a plurality of pixel regions, and each pixel region corresponds to a group of source lines, wherein a first electrode and a second electrode are arranged in each pixel region, the first electrode and the second electrode are adjacent and electrically isolated from each other, and the first electrode and the second electrode serve as pixel electrodes for display and a sensing electrode and a driving electrode for touch control in a time division multiplexed manner.

The present invention further provides a display device, including the above-mentioned array substrate.

The present invention further provides a driving method of the array substrate, wherein the array substrate includes a display region and a non-display region, multiple groups of source lines and a plurality of gate lines are arranged in the display region, the multiple groups of source lines and the plurality of gate lines are intersected with each other to divide the display region into a plurality of pixel regions, each pixel region corresponds to a group of source lines, and a first electrode and a second electrode which are electrically isolated from each other are adjacently arranged in each pixel region; and the driving method includes: causing the first electrode and the second electrode to serve as pixel electrodes for display and a sensing electrode and a driving electrode for touch control in a time division multiplexed manner.

Figure 1:
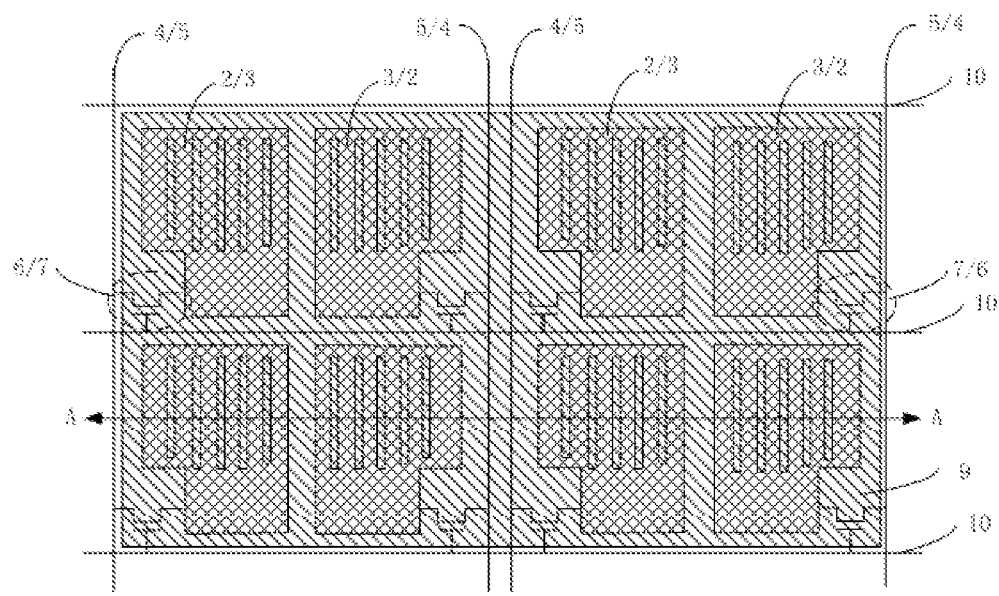
FIG. 1 is a schematic plan view of an array substrate in embodiment 1 of the present invention.
Figure 2:
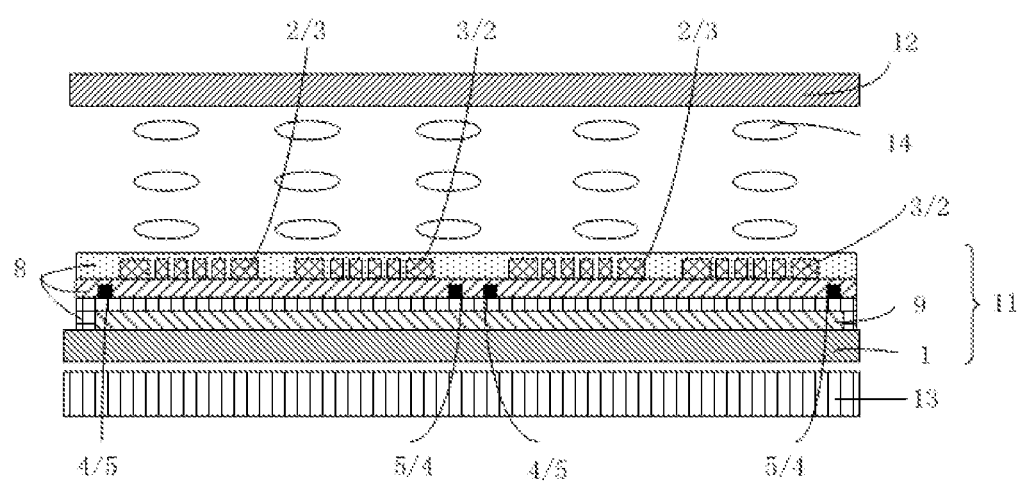
FIG. 2 is a cross-sectional view of the array substrate in FIG. 1 taken along an A-A section line.

Embodiment 1:

As shown in FIG. 1 and FIG. 2, this embodiment provides an array substrate, including a display region and a non-display region, wherein multiple groups of source lines and a plurality of gate lines are arranged in the display region, the multiple groups of source lines and the plurality of gate lines are intersected with each other to divide the display region into a plurality of pixel regions, a first electrode 2 and a second electrode 3 are arranged in each pixel region, the first electrode 2 and the second electrode 3 are adjacent and electrically isolated from each other, and the first electrode 2 and the second electrode 3 serve as pixel electrodes for display and a sensing electrode and a driving electrode for touch control in a time division multiplexed manner.

Combining FIG. 1 with FIG. 2, a group of source lines includes a first source line 4 and a second source line 5, a first thin film transistor 6 and a second thin film transistor 7 are arranged in each pixel region, the drain of the first thin film transistor 6 is electrically connected with the first electrode 2, the source of the first thin film transistor 6 is electrically connected with the first source line 4, the drain of the second thin film transistor 7 is electrically connected with the second electrode 3, and the source of the second thin film transistor 7 is electrically connected with the second source line 5. That is, in this embodiment, the two electrodes in the same pixel region are preferably respectively electrically connected with the two thin film transistors, so that each electrode operates independently.

Correspondingly, the two source lines included in each group of source lines are respectively electrically connected with the two thin film transistors, so that when the first electrode and the second electrode respectively serve as the sensing electrode and the driving electrode for touch control, the first source line and the second source line also respectively serve as a sensing signal line Rx and a driving signal line Tx.

In each pixel region, the first thin film transistor 6 and the second thin film transistor 7 may respectively correspond to two gate lines 10. Preferably, as shown in FIG. 1, in each pixel region, the first thin film transistor 6 and the second thin film transistor 7 are electrically connected with the same gate line 10, so that the array substrate has a simpler structure, facilitating the manufacturing. Under the coaction of the gate line 10 and the first source line 4, when the first thin film transistor 6 is turned on, the drain of the first thin film transistor 6 supplies power to the first electrode 2; and under the coaction of the gate line 10 and the second source line 5, when the second thin film transistor 7 is turned on, the drain of the second thin film transistor 7 supplies power to the second electrode 3.

With reference to FIG. 1 and FIG. 2, it should be noted herein that, the first thin film transistor 6 and the second thin film transistor 7 are arranged in a first base substrate 1 (which is a part of the array substrate 11), which is not specifically shown in FIG. 2. It could also be seen from FIG. 2 that, a common electrode 9 is arranged above the first thin film transistor 6 and the second thin film transistor 7; an insulating layer 8 with an electrical isolation effect is respectively arranged between the first thin film transistor 6 and the second thin film transistor 7, between the first electrode 2 and the second electrode 3 and within the common electrode 9; according to the specific structure of the array substrate 11, the insulating layer 8 may be a passivation layer or a planarization layer and is generally made of a transparent material such as silicon oxide, silicon nitride, hafnium oxide, silicon oxynitride or aluminum oxide; since the structure and manufacturing process of the insulating layer are the same as those in the prior art, they are not redundantly described herein; and meanwhile, since the insulating layer is generally made of the transparent material and does not hinder the observation of the plan view in FIG. 1, the insulating layer 8 is omitted in the schematic plan view of FIG. 1.

When the array substrate is applied to a liquid crystal display panel of a display device and powered on through a source driver in the display device, the first electrode 2 and the second electrode 3 may serve as pixel electrodes for display and a sensing electrode and a driving electrode for touch control in a time division multiplexed manner. It should be understood herein that, the specific positions of the two electrodes arranged in the same pixel region are not specially required, as long as the first electrode 2 and the second electrode 3 are adjacent and electrically isolated from each other, namely the two electrodes may be arranged in parallel longitudinally or transversely and even may be staggered with each other, as long as the two electrodes serve as pixel electrodes for display and a sensing electrode and a driving electrode for touch control in a time division multiplexed manner.

This embodiment further provides a display device including the above-mentioned array substrate. This embodiment is described in detail by taking a liquid crystal display device of ADvanced super dimension switch (ADS for short) mode as an example. In the liquid crystal display device of ADvanced super dimension switch mode, an electric field generated at edges of slit electrodes in the same plane and an electric field generated between a slit electrode layer and a plate-like electrode layer form a multi-dimensional electric field, so that all oriented liquid crystal molecules between the slit electrodes and above the electrodes in a liquid crystal cell may rotate, thus improving the working efficiency of liquid crystal and improving the transmittance. The ADvanced super dimension switch technology may improve the picture quality of the liquid crystal display device, and has the advantages of high resolution, high transmittance, low power consumption, wide viewing angle, high aperture ratio, low chromatic aberration, no push Mura and the like.

The liquid crystal display device of ADS mode in this embodiment further includes a color filter substrate 12 besides the above-mentioned array substrate, and the color filter substrate 12 is arranged opposite to the array substrate 11. In this case, the array substrate 11 further includes a common electrode 9, and the common electrode 9 is at least partially overlapped with the first electrodes 2 and the second electrodes 3 in the orthographic projection direction. In this embodiment, both the first electrodes 2 and the second electrodes 3 are slit-like or plate-like, and correspondingly, the common electrode 9 may be plate-like or slit-like.

In the display device of this embodiment, a liquid crystal layer is arranged between the color filter substrate 12 and the array substrate 11, and the liquid crystal layer includes a plurality of liquid crystal molecules 14. Because liquid crystal itself does not emit light, a backlight 13 is arranged on one side, far from the color filter substrate 12, of the array substrate 11 in this display device.

Figure 3:
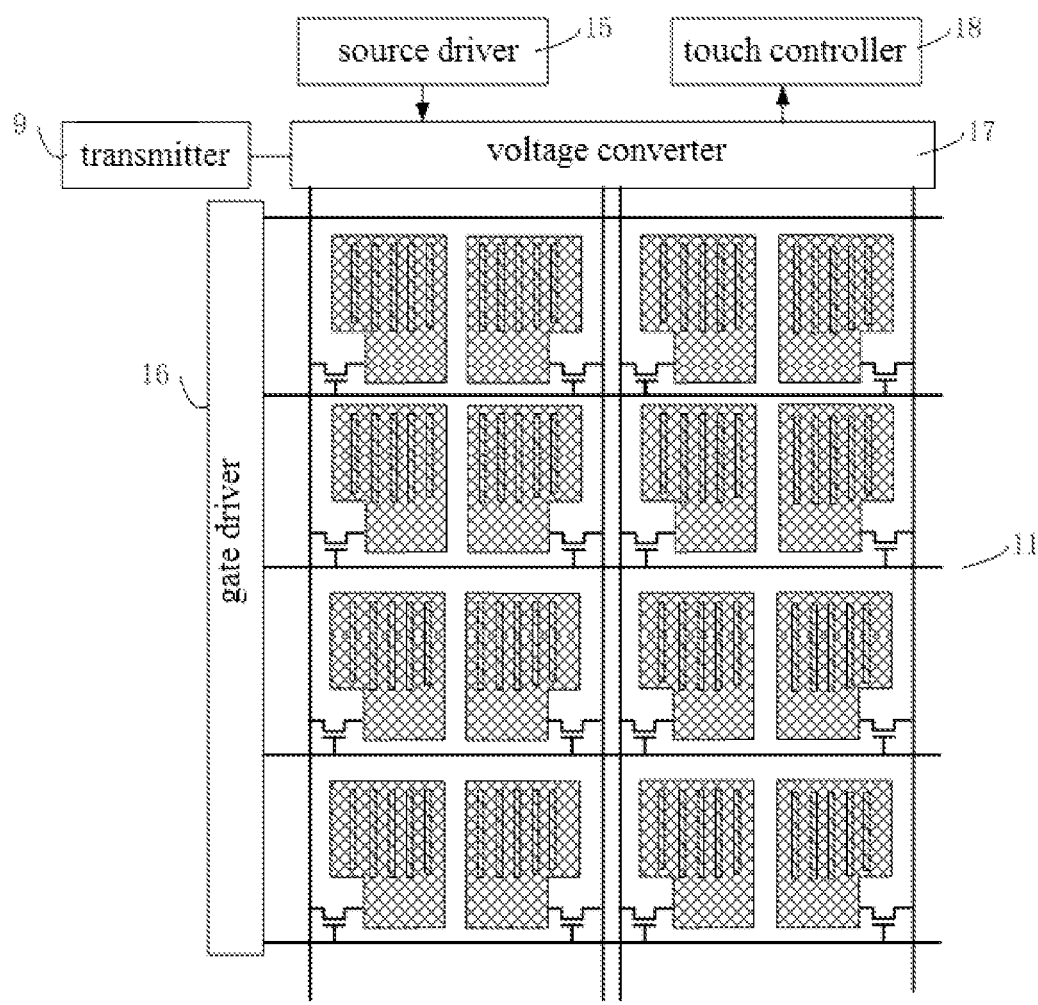
FIG. 3 is a timing sequence diagram of a driving method of the array substrate in embodiment 1 of the present invention.

As mentioned above, the array substrate 11 includes the first thin film transistors 6 and the second thin film transistors 7. As shown in FIG. 3, the display device further includes a gate driver 16 and a source driver 15 which are arranged in the non-display region, the gate driver 16 is electrically connected with the plurality of gate lines 10 and generates a scanning signal voltage, and the scanning signal voltage is transmitted to the gates of the thin film transistors electrically connected with the gate lines 10 through the gate lines 10, to provide a scanning signal to the first thin film transistors 6 and the second thin film transistors 7, so as to control turn-on and turn-off of the first thin film transistors 6 and the second thin film transistors 7.

Similarly, in order that the array substrate has a simpler structure to facilitate the manufacturing, preferably in each pixel region, the gate of the first thin film transistor 6 and the gate of the second thin film transistor 7 are electrically connected with the same gate line 10.

The source driver 15 is electrically connected with the multiple groups of source lines and generates a data signal voltage, and the data signal voltage is transmitted to the sources of the first thin film transistors 6 electrically connected with the first source lines 4 through the first source lines 4 and transmitted to the sources of the second thin film transistors 7 electrically connected with the second source lines 5 through the second source lines 5. The first electrodes 2 are indirectly electrically connected with the source driver 15 through the drains of the first thin film transistors 6 connected with the first electrodes 2 to acquire a video data signal, and the second electrodes 3 are indirectly electrically connected with the source driver 15 through the drains of the second thin film transistors 7 connected with the second electrodes 3 to acquire the video data signal.

In this embodiment, the display device further includes a voltage converter 17, which is arranged in the non-display region, electrically connected with the source driver 15 to receive a data signal transmitted by the source driver 15, and also respectively electrically connected with the sources of the first thin film transistors 6 and the sources of the second thin film transistors 7 to transmit the data signal to the sources of the first thin film transistors 6 and the sources of the second thin film transistors 7.

To conveniently control the first electrodes 2 and the second electrodes 3 to respectively achieve display and touch control effects within different time periods, preferably, as shown in FIG. 3, the display device further includes a transmitter 19 and a touch controller 18 which are arranged in the non-display region, the transmitter 19 is electrically connected with the voltage converter 17 to transmit a control signal to the voltage converter 17, the touch controller 18 is electrically connected with the voltage converter 17, the voltage converter 17 is electrically connected with the first electrodes 2 through the drains of the first thin film transistors 6 and electrically connected with the second electrodes 3 through the drains of the second thin film transistors 7, and the touch controller 18 is configured to acquire a sensing signal and transmit a driving signal through the voltage converter 17.

That is, in this embodiment, the voltage converter 17 may simultaneously provide a data signal provided by the source driver 15 to the first electrodes 2 and the second electrodes 3 (at the moment, both the first electrodes 2 and the second electrodes 3 are pixel electrodes) respectively through the first thin film transistors 6 and the second thin film transistors 7 within a first time period to realize picture display, the voltage converter 17 may receive a voltage which is obtained from the first electrodes 2 (at the moment, the first electrodes 2 are sensing electrodes) and the second electrodes 3 (at the moment, the second electrodes 3 are driving electrodes) due to body touch and is different from a reference voltage value, and the coordinates of a touch position are calculated by the touch controller 18 to realize touch control.

In this embodiment, in each pixel region, a part corresponding to the first electrode 2 may be called as a first pixel region, and a part corresponding to the second electrode 3 may be called as a second pixel region. That is to say, in the working process of the display device, the first electrode 2 and the second electrode 3 simultaneously and respectively receive the drain voltage of the first thin film transistor 6 electrically connected with the first electrode 2 and the drain voltage of the second film transistor 7 electrically connected with the second electrode 3, so as to drive liquid crystal molecules to deflect to realize picture display, or, when a user touches a position between the first pixel region and the second pixel region, the electric field formed between the first electrode 2 and the second electrode 3 is changed, and then the touch is sensed, so that the purpose of touch control is achieved.

It should be understood herein that, the touch controller 18 in this embodiment simultaneously integrates a touch sensing function and a touch driving function therein. However, the touch controller is not limited to be necessarily integrated to reduce the chip cost in this embodiment, and the touch controller in this embodiment may also be realized by a combination of a chip with a function of receiving touch sensing and a chip with a function of transmitting touch driving.

Correspondingly, this embodiment further provides a driving method of an array substrate in a display device. Based on the structure of the array substrate as shown in FIG. 1 or FIG. 2, multiple groups of source lines and a plurality of gate lines are arranged in the display region of the array substrate, the multiple groups of source lines and the plurality of gate lines are intersected with each other to divide the display region into a plurality of pixel regions, and a first electrode and a second electrode which are electrically isolated from each other are adjacently arranged in each pixel region; and the driving method includes: causing the first electrode and the second electrode to serve as pixel electrodes for display and a sensing electrode and a driving electrode for touch control in a time division multiplexed manner.

Figure 4:
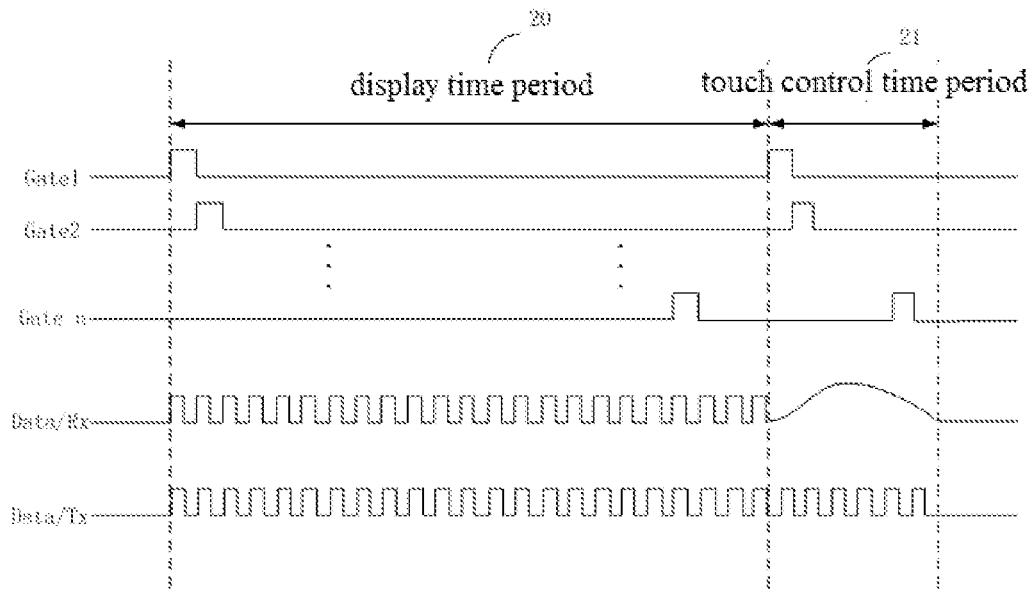
FIG. 4 is a schematic diagram of a driving circuit of a display device in embodiment 1 of the present invention.

To ensure normal display of the display device, as shown in FIG. 4, the driving method includes causing the first electrode 2 and the second electrode 3 to serve as the pixel electrodes for display within a first time period 20 and serve as the sensing electrode and the driving electrode for touch control within a second time period 21, the first time period 20 is longer than or equal to the second time period 21, and the sum of the first time period 20 and the second time period 21 is equal to a frame cycle.

Similarly, based on the structure of the above-mentioned array substrate, that is, a first thin film transistor 6 and a second thin film transistor 7 are arranged in each pixel region, a group of source lines includes a first source line 4 and a second source line 5, the drain of the first thin film transistor 6 is electrically connected with the first electrode 2, the source of the first thin film transistor 6 is electrically connected with the first source line 4, the drain of the second thin film transistor 7 is electrically connected with the second electrode 3, and the source of the second thin film transistor 7 is electrically connected with the second source line 5; and the driving method includes: outputting a first signal to the source of the first thin film transistor 6 through the first source line 4, and outputting a second signal to the source of the second thin film transistor 7 through the second source line 5, wherein the first signal and the second signal are video data signals within the first time period 20, the first signal is a touch sensing signal within the second time period 21, the second signal is a touch driving signal within the second time period 21, the first source line 4 is a data line within the first time period 20 and a sensing signal line within the second time period 21, and the second source line 5 is a data line within the first time period 20 and a driving signal line within the second time period 21.

The driving method of this embodiment further includes a step of providing a scanning signal to the first thin film transistor 6 and the second thin film transistor 7 through the gate line 10. The scanning signal is used for controlling turn-on and turn-off of the thin film transistors electrically connected with the gate line 10. Since in each pixel region, the gate of the first thin film transistor 6 and the gate of the second thin film transistor 7 are electrically connected with the same gate line 10, the driving method includes: outputting a scanning signal to the gate of the first thin film transistor 6 and the gate of the second thin film transistor 7 through the gate line 10, to respectively control turn-on and turn-off of the first thin film transistor 6 and the second thin film transistor 7. Wherein, the scanning signal is a square wave pulse signal.

As shown in FIG. 4, in the implementation provided by this embodiment, the frame cycle that the display device displays a frame of picture is divided into two time periods, the first time period 20 is a display time period, the second time period 21 is a touch control time period, and the first time period 20 precedes the second time period 21 in time. The first thin film transistor 6 and the second thin film transistor 7 are simultaneously selected within the first time period 20 and respectively turned on at least once, and the first thin film transistor 6 and the second thin film transistor 7 are simultaneously selected within the second time period 21 and respectively turned on at least once.

Meanwhile, it could be seen from FIG. 4 that, the scanning signal is a square wave pulse signal, and for convenience of control, the width of the square wave of the scanning signal within the first time period 20 may be equal to that within the second time period 21. Of course, the widths of the square wave of the scanning signal within the first time period 20 and the second time period 21 may also be reasonably configured according to the ratio of the first time period 20 to the second time period 21, so that the width of the square wave of the scanning signal within the first time period 20 is smaller than or greater than that within the second time period 21.

To ensure that the first electrodes 2 and the second electrodes 3 in the array substrate 11 serve as pixel electrodes for display and sensing electrodes and driving electrodes for touch control in a time division multiplexed manner, the scanning signal of the plurality of gate lines 10 sequentially and circularly scans within the first time period 20 to select the first thin film transistors 6 and the second thin film transistors 7 electrically connected with the gate lines 10, and sequentially and circularly scans within the second time period 21 to select the first thin film transistors 6 and the second thin film transistors 7 electrically connected with the gate lines 10.

Preferably, the scanning signal within the first time period 20 merely includes a narrow-pulse high-level signal, the first thin film transistors 6 and the second thin film transistors 7 in different rows of the array substrate 11 are turned on sequentially row by row within the first time period 20 to realize picture display, the scanning signal within the second time period 21 merely includes a narrow-pulse high-level signal, and the first thin film transistors 6 and the second thin film transistors 7 in different rows of the array substrate 11 are turned on sequentially row by row within the second time period 21 to realize touch control. In the display device provided by this embodiment, the above-mentioned steps may be realized by the coaction of the transmitter 19 and the voltage converter 17.

It should be understood herein that, it is a preferred embodiment in which the first thin film transistor and the second thin film transistor are electrically connected with the same gate line, and correspondingly preferably, the first thin film transistor and the second thin film transistor are selected or not selected by the same scanning signal. It is easily understood that, the scanning signal may also not be limited to the same one, namely it may be configured that the first thin film transistor is electrically connected with a first scanning line and controlled by a first scanning signal to be selected or not selected, and the second thin film transistor is electrically connected with a second scanning line and controlled by a second scanning signal to be selected or not selected, as long as the first electrode and the second electrode may be coordinated to realize a display function and a touch control function in a time division multiplexed manner within different time periods.

The process of realizing the display function and the touch control function within different time periods will be described in detail in combination with FIG. 4 by taking the liquid crystal display device of ADS mode provided by this embodiment as an example. When the display device is driven, the specific working process of the display device is as follows.

(1) Within the first time period 20: the gate lines 10 (Gate 1, Gate 2 . . . Gate n) in the array substrate 11 are sequentially selected, a scanning signal in the gate driver 16 is sequentially written into the gate of the first thin film transistor 6 and the gate of the second thin film transistor 7 (merely taking two thin film transistors in the same pixel region as an example herein) electrically connected with the gate line 10 through the gate line 10; meanwhile, the voltage converter 17 receives a data signal from the source driver 16 under the condition that a control signal transmitted by the transmitter 19 is received, provides a data signal voltage to the source of the first thin film transistor 6 through the first source line 4 (which is a data line Data at the moment) and provides a data signal voltage to the source of the second thin film transistor 7 through the second source line 5 (which is a data line Data at the moment) at the same time, namely a display data signal is sequentially written into the sources of the first thin film transistor 6 and the second thin film transistor 7 through the first source line 4 and the second source line 5; and when the first thin film transistor 6 and the second thin film transistor 7 are turned on, the first electrode 2 and the second electrode 3 are powered on and co-act with the common electrode 9 (the pixel electrodes are at least partially overlapped with the common electrode 9 in the orthographic projection direction) to form an electric field, and the electric field acts on liquid crystal molecules to drive the liquid crystal molecules 14 between the array substrate 11 and the color filter substrate 12, so that the deflecting directions of the liquid crystal molecules 14 are changed to realize picture display, wherein at the moment, the first electrode 2 and the second electrode 3 serve as pixel electrodes for display.

(2) Within the second time period 21: the gate lines 10 (Gate 1, Gate 2 . . . Gate n) in the array substrate 11 are simultaneously selected, a scanning signal in the gate driver 16 is sequentially written into the first thin film transistor 6 and the second thin film transistor 7 (similarly, merely taking two thin film transistors in the same pixel region as an example herein) electrically connected with the gate line 10 through the gate line 10, at the moment, the first electrode 2 serves as a sensing electrode for touch control, the second electrode 3 serves as a driving electrode for touch control, the first electrode 2 and the second electrode 3 in the same pixel region form a structure of a paired sensing electrode and driving electrode, correspondingly, the first source line 4 electrically connected with the first thin film transistor 6 electrically connected with the first electrode 2 is a sensing signal line Rx, the second source line 5 electrically connected with the second thin film transistor 7 electrically connected with the second electrode 3 is a driving signal line Tx, and the sensing signal lines Rx and the driving signal lines Tx in the adjacent pixel regions are sequentially arranged alternately. When the gate lines Gate 1, Gate 2 . . . Gate n are selected, the sensing electrodes are communicated with the touch controller 18 by the sensing signal lines Rx through the voltage converter 17, and the driving electrodes are communicated with the touch controller 18 by the driving signal lines Tx through the voltage converter 17. When the voltage converter 17 receives a control signal transmitted by the transmitter 19, the voltage converter 17 loads a touch control driving signal to the second electrode 3 serving as a driving electrode through the driving signal line Tx, and detects a voltage signal coupled by a sensing capacitor (at the moment, the first electrode 2 and the second electrode 3 are respectively two polar plates of the sensing capacitor) and returned by the sensing signal line Rx. In this process, when a user touches the first pixel region and the second pixel region (equivalent to touch panels corresponding to the pixel regions), the electric field of the user acts on the sensing capacitor, so that the capacitance value of the sensing capacitor is changed, and the coupled voltage value is further changed; and then the voltage signal returned from the touch control sensing signal line Tx to the voltage converter 17 is changed, and the touch position may be determined according to the change of the voltage signal, so that touch control is realized, wherein at the moment, the first electrode 2 and the second electrode 3 respectively serve as a sensing electrode and a driving electrode for touch control.

It should be understood herein that, the above-mentioned working process of the display device is described by using the first electrode and the second electrode in the same pixel region as an example. It could be understood that, when the finger of the user touches the first electrodes or the second electrodes in different pixel regions, because there is a certain contact area between the finger of the user and the display panel generally, the touch is continuous (namely is generally body touch not lower the sensing precision), and as mentioned above, the first electrodes and the second electrodes respectively serve as sensing electrodes and driving electrodes; when the display device is provided with a plurality of pixel regions arranged according to a certain rule, the sensing electrodes and the driving electrodes are ensured to be arranged adjacently at intervals; thus, even if the body touch attaches to different pixel regions (e.g. a user touches the driving electrode of the first pixel region and the sensing electrode of the second pixel region, or, the user touches the sensing electrode of the first pixel region and the driving electrode of the second pixel region), the effect of touch control is not influenced.

The first time period and the second time period may be determined according to the specific application environment of the display device and the conditions such as response precision and touch control precision. For example, taking the frequency of 60 Hz as an example, the frame cycle of the display device for displaying a frame is 16.7 ms, then 12.7 ms may be selected as the display time period, and the remaining 4 ms is selected as the touch control time period. Of course, the lengths of the two time periods may also be appropriately adjusted according to the processing capability of an IC chip for control in the display device, which is not specifically limited herein.

In addition, as a variation of the array substrate in this embodiment, only one paired sensing electrode and driving electrode may be arranged in a plurality of spaced pixel regions according to requirements on the touch control precision of a product, and a corresponding sensing signal line Rx and a corresponding driving signal line Tx are accordingly arranged. Meanwhile, in order that the first electrode and the second electrode in the pixel regions serve as pixel electrodes for display and a sensing electrode and a driving electrode for touch control in a time division multiplexed manner, control programs of the transmitter are correspondingly modified.

Figure 5:
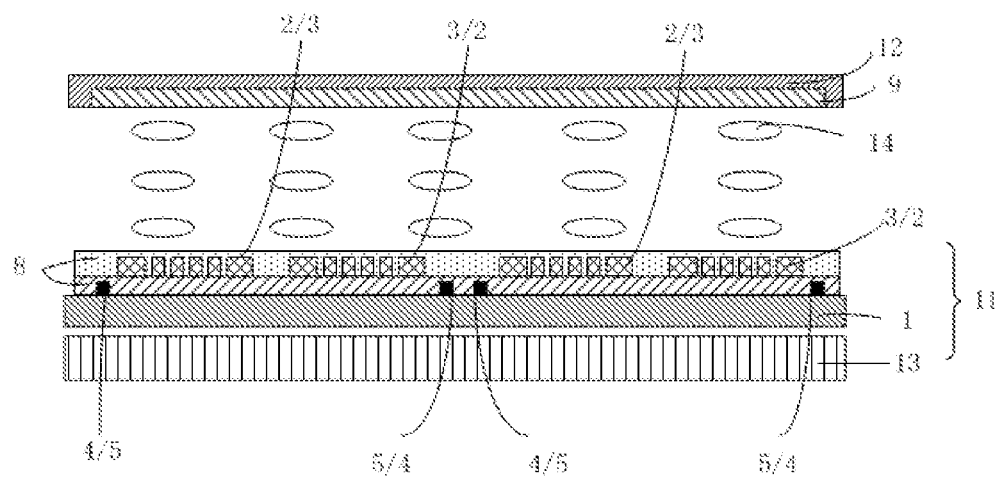
FIG. 5 is a cross-sectional view of an array substrate in embodiment 2 of the present invention taken along the A-A section line in FIG. 1.

Embodiment 2:

As shown in FIG. 5, this embodiment differs from embodiment 1 in that, in this embodiment, the display device still includes a first electrode 2, a second electrode 3 and a common electrode 9, wherein the first electrode 2 and the second electrode 3 are still arranged on the array substrate 11, the common electrode 9 is arranged on the color filter substrate 12, and the common electrode 9 is at least partially overlapped with the first electrode 2 and the second electrode 3 in the orthographic projection direction.

That is, the display device of this embodiment is a liquid crystal display device of TN (Twisted Nematic) or VA (Vertical Alignment) mode.

Except that the array substrate 11 in this embodiment is not provided with the common electrode 9 and the insulating layer 8 corresponding to the common electrode, other structures are the same as those of the array substrate 11 in embodiment 1. Meanwhile, the first electrode 2 and the second electrode 3 in the display device serve as pixel electrodes for display and a sensing electrode and a driving electrode for touch control in a time division multiplexed manner, and the corresponding driving method is also the same as that in embodiment 1, which is not redundantly described herein.

Embodiment 3:

This embodiment differs from embodiment 1 or 2 in that, in this embodiment, the display device includes a first electrode and a second electrode which are arranged on an array substrate and respectively serve as anodes of OLED (Organic Light-Emitting Diode).

That is, the display device of this embodiment is an AMOLED (Active Matrix OLED) display device. Because OLED itself may emit light, a backlight 13 is not needed in this display device compared with the liquid crystal display device in embodiment 1 or 2.

Except that the first electrode and the second electrode are directly used as the anodes of two OLEDs in the same pixel region, other structures of the array substrate in this embodiment are the same as those of the array substrate in embodiment 1 or 2. Meanwhile, the first electrode and the second electrode in the display device serve as pixel electrodes for display and a sensing electrode and a driving electrode for touch control in a time division multiplexed manner, and the corresponding driving method is also the same as that in embodiment 1 or 2, which is not redundantly described herein.

In the display device of embodiments 1 to 3, the array substrate realizes a display function and a touch control function within different time periods by using the two electrodes in the same pixel region, and meanwhile, realizes a data line function and a sensing signal line/driving signal line function within different time periods by using the corresponding source lines, namely the pixel electrodes and the sensing electrode/driving electrode are of the same electrodes, so based on the pixel electrodes for display in the existing display device, the sensing electrode/driving electrode and the sensing signal line/driving signal line for touch control do not need to be additionally manufactured, electrode materials are saved, the process steps are greatly simplified, the production cost is reduced, and the product yield is improved.

It could be understood that, the above implementations are merely exemplary implementations adopted for describing the principle of the present invention, rather than limiting the present invention. Various variations and improvements may be made by persons skilled in the art without departing from the spirit and essence of the present invention, and these variations and improvements are regarded within the protection scope of the present invention.

The invention claimed is:

1. An array substrate, comprising a display region and a non-display region, wherein multiple groups of source lines and a plurality of gate lines are arranged in the display region, the multiple groups of source lines and the plurality of gate lines are intersected with each other to divide the display region into a plurality of pixel regions, and each pixel region corresponds to a group of source lines, wherein a first electrode and a second electrode are arranged in each pixel region, the first electrode and the second electrode are adjacent and electrically isolated from each other, and the first electrode and the second electrode serve as pixel electrodes for display and a sensing electrode and a driving electrode for touch control in a time division multiplexed manner; and wherein a group of source lines comprises a first source line and a second source line, a first thin film transistor and a second thin film transistor, each of which have a source and a drain, are arranged in each pixel region, the drain of the first thin film transistor is electrically connected with the first electrode, the source of the first thin film transistor is electrically connected with the first source line, the drain of the second thin film transistor is electrically connected with the second electrode, and the source of the second thin film transistor is electrically connected with the second source line.

2. The array substrate of claim 1, wherein in each pixel region, the gate of the first thin film transistor and the gate of the second thin film transistor are electrically connected with the same gate line.

3. The array substrate of claim 2, wherein the first electrode and the second electrode are slit-like or plate-like.

4. A display device, comprising an array substrate, wherein the array substrate comprises a display region and a non-display region, multiple groups of source lines and a plurality of gate lines are arranged in the display region, the multiple groups of source lines and the plurality of gate lines are intersected with each other to divide the display region into a plurality of pixel regions, and each pixel region corresponds to a group of source lines, wherein a first electrode and a second electrode are arranged in each pixel region, the first electrode and the second electrode are adjacent and electrically isolated from each other, and the first electrode and the second electrode serve as pixel electrodes for display and a sensing electrode and a driving electrode for touch control in a time division multiplexed manner; and wherein the display device further comprises a gate driver and a source driver which are arranged in the non-display region, the gate driver is electrically connected with the plurality of gate lines, and the source driver is electrically connected with the multiple groups of source lines; and a group of source lines comprises a first source line and a second source line, a first thin film transistor and a second thin film transistor, each of which have a source and a drain, are arranged in each pixel region, the drain of the first thin film transistor is electrically connected with the first electrode, the source of the first thin film transistor is electrically connected with the first source line, the drain of the second thin film transistor is electrically connected with the second electrode, and the source of the second thin film transistor is electrically connected with the second source line; and the display device further comprises a voltage converter, which is arranged in the non-display region, electrically connected with the source driver to receive a data signal transmitted by the source driver, and also electrically connected with the source of the first thin film transistor and the source of the second thin film transistor to transmit the data signal to the source of the first thin film transistor and the source of the second thin film transistor.

5. The display device of claim 4, wherein the display device further comprises a transmitter and a touch controller which are arranged in the non-display region, the transmitter is electrically connected with the voltage converter to transmit a control signal to the voltage converter, the touch controller is electrically connected with the voltage converter, the voltage converter is electrically connected with the first electrode through the drain of the first thin film transistor and electrically connected with the second electrode through the drain of the second thin film transistor, and the touch controller is configured to acquire a sensing signal and transmit a driving signal through the voltage converter.

6. The display device of claim 4, wherein the display device further comprises a common electrode, and the common electrode is at least partially overlapped with the first electrode and the second electrode in the orthographic projection direction.

7. The display device of claim 6, wherein the common electrode is included in a color filter substrate.

8. A driving method of an array substrate, wherein the array substrate comprises a display region and a non-display region, multiple groups of source lines and a plurality of gate lines are arranged in the display region, the multiple groups of source lines and the plurality of gate lines are intersected with each other to divide the display region into a plurality of pixel regions, each pixel region corresponds to a group of source lines, and a first electrode and a second electrode which are electrically isolated from each other are adjacently arranged in each pixel region; and the driving method comprises: causing the first electrode and the second electrode to serve as pixel electrodes for display and a sensing electrode and a driving electrode for touch control in a time division multiplexed manner; wherein the first electrode and the second electrode serve as the pixel electrodes for display within a first time period and serve as the sensing electrode and the driving electrode for touch control within a second time period, the first time period is longer than or equal to the second time period, and the sum of the first time period and the second time period is equal to a frame cycle; and a first thin film transistor and a second thin film transistor, each of which have a source and a drain, are arranged in each pixel region, a group of source lines comprises a first source line and a second source line, the drain of the first thin film transistor is electrically connected with the first electrode, the source of the first thin film transistor is electrically connected with the first source line, the drain of the second thin film transistor is electrically connected with the second electrode, and the source of the second thin film transistor is electrically connected with the second source line; and the driving method comprises: outputting a first signal to the source of the first thin film transistor through the first source line, and outputting a second signal to the source of the second thin film transistor through the second source line, wherein the first signal is a video data signal within the first time period and a sensing signal within the second time period, the second signal is a video data signal within the first time period and a driving signal within the second time period, the first source line is a data line within the first time period and a sensing signal line within the second time period, and the second source line is a data line within the first time period and a driving signal line within the second time period.

9. The driving method of claim 8, wherein in each pixel region, the gate of the first thin film transistor and the gate of the second thin film transistor are electrically connected with the same gate line; and the driving method comprises: outputting a scanning signal to the gate of the first thin film transistor and the gate of the second thin film transistor through the gate line, wherein the scanning signal is a square wave pulse signal.

10. The driving method of claim 9, wherein the scanning signal sequentially and circularly scans within the first time period to select the first thin film transistor and the second thin film transistor electrically connected with the gate line, and the scanning signal sequentially and circularly scans within the second time period to select the first thin film transistor and the second thin film transistor electrically connected with the gate line.

11. The driving method of claim 10, wherein the first thin film transistor and the second thin film transistor are simultaneously selected within the first time period and respectively turned on at least once, and the first thin film transistor and the second thin film transistor are simultaneously selected within the second time period and respectively turned on at least once.

\* \* \* \* \*